(12) United States Patent
Yang et al.

(10) Patent No.: US 9,478,315 B2
(45) Date of Patent: Oct. 25, 2016

(54) BIT ERROR RATE MAPPING IN A MEMORY SYSTEM

(71) Applicant: SanDisk Technologies Inc., Plano, TX (US)

(72) Inventors: Nian Niles Yang, Mountain View, CA (US); Jianmin Huang, San Carlos, CA (US); Alexandra Bauche, San Jose, CA (US)

(73) Assignee: SanDisk Technologies LLC, Plano, TX (US)

( * ) Notice: Subject to any disclaimer, the term of this patent is extended or adjusted under 35 U.S.C. 154(b) by 9 days.

(21) Appl. No.: 14/294,864

(22) Filed: Jun. 3, 2014

(65) Prior Publication Data

US 2015/0348649 A1 Dec. 3, 2015

(51) Int. Cl.
*G11C 29/44* (2006.01)
*G11C 29/52* (2006.01)
*G06F 3/06* (2006.01)
*G06F 12/02* (2006.01)
*G06F 11/07* (2006.01)
*G11C 29/04* (2006.01)

(52) U.S. Cl.
CPC .............. *G11C 29/44* (2013.01); *G11C 29/52* (2013.01); *G06F 3/0679* (2013.01); *G06F 11/073* (2013.01); *G06F 11/076* (2013.01); *G06F 11/0793* (2013.01); *G06F 12/0246* (2013.01); *G11C 2029/0411* (2013.01)

(58) Field of Classification Search
CPC ............ G11C 29/44; G11C 29/52; G11C 2029/0411; G06F 11/076; G06F 11/0793; G06F 11/073; G06F 12/0246; G06F 3/0679
USPC .................. 711/118; 714/704, 764, 768, 773
See application file for complete search history.

(56) References Cited

U.S. PATENT DOCUMENTS

| 8,187,936 | B2 | 5/2012 | Alsmeier | |
|---|---|---|---|---|
| 2002/0144078 | A1* | 10/2002 | Topham | G06F 12/1054 711/203 |
| 2009/0055680 | A1* | 2/2009 | Honda | G06F 11/1068 714/5.1 |
| 2010/0124887 | A1* | 5/2010 | Wellington | H04W 24/04 455/69 |
| 2010/0313084 | A1* | 12/2010 | Hida | G06F 11/1068 714/704 |
| 2014/0258804 | A1* | 9/2014 | Pangal | G06F 11/1048 714/752 |
| 2014/0344641 | A1* | 11/2014 | Jeong | G06F 12/0864 714/759 |
| 2015/0143054 | A1* | 5/2015 | Ackaret | G06F 11/0754 711/133 |
| 2015/0205664 | A1* | 7/2015 | Janik | G06F 11/1008 714/764 |

OTHER PUBLICATIONS

Application as Filed for U.S. Appl. No. 14/133,979, filed Dec. 19, 2013, 121 pages.

(Continued)

*Primary Examiner* — Cynthia Britt
*Assistant Examiner* — Sazzad Hossain
(74) *Attorney, Agent, or Firm* — Brinks Gilson & Lione

(57) ABSTRACT

A memory system or flash memory device may include identify a bit error rate (BER) mapping for the memory. The BER mapping may be used for identifying erroneous bits, managing them, and using them for the system maintenance and system recovery. A complete BER map may be stored in main memory while a cached version of the BER map may be stored in random access memory (RAM). The cached version may identify only the top and bottom bits rather than the complete map. The cached BER map may be updated based on future reads and future programming may rely on the cached BER map for selecting blocks to program.

20 Claims, 7 Drawing Sheets

(56) References Cited

OTHER PUBLICATIONS

Application as Filed for U.S. Appl. No. 14/136,103, filed Dec. 20, 2013, 56 pages.

Arya, P., "A Survey of 3D Nand Flash Memory", *EECS Int'l Graduate Program, National Chiao Tung University*, 2012, pp. 1-11.

Fisher, Ryan, "Optimizing NAND Flash Performance," Santa Clara, California, Aug. 2008, 23 pages.

Jang et al., "Vertical Cell Array using TCAT(Terabit Cell Array Transistor) Technology for Ultra High Density NAND Flash Memory," *2009 Symposium on VLSI Technology Digest of Technical Papers*, pp. 192-193, 2009.

Mohan, Vidyabhushan, "Modeling the Physical Characteristics of NAND Flash Memory," Powerpoint Presentation, undated, 22 pp.

Micheloni, R. "NAND Overview: From Memory to Systems," from *Inside* NAND *Flash Memories*, DO1 10.1007/978-90-481-9431-5555_2, © Springer Science+Business Media B.V. 2010, pp. 19-53.

Micron Technical Note, "TN-29-25: Improving Performance Using Two-Plane Commands," Source: 09005aef82cfa647, Micron Technology, Inc., 2007, 11 pp.

Nowak, E. et al., "Intrinsic Fluctuations in Vertical NAND Flash Memories", *2012 Symposium on VLSI Technology Digest of Technical Papers*, 2012, pp. 21-22.

\* cited by examiner

BIT ERROR RATE MAPPING IN A MEMORY SYSTEM

TECHNICAL FIELD

This application relates generally to memory devices. More specifically, this application relates to error rate management in memory with a bit error rate mapping of the memory.

BACKGROUND

Non-volatile memory (NVM) systems, such as flash memory, have been widely adopted for use in consumer products. In addition to NAND flash memory, other exemplary memories may include NOR, ORNAND, 3D memory and charge trapping memory with material such as silicon nitride, and phase change memory such as ReRAM, and semi-volatile memory such as DRAM and SRAM.

Flash memory may be found in different forms, for example in the form of a portable memory card that can be carried between host devices or as a solid state disk (SSD) embedded in a host device. Flash memory may be written in pages and erased in blocks, so once a page is written, a rewrite may require the whole block to be erased. Rewrites may be necessary if there is a write error or failure.

The flash memory blocks used in the solid state storage system may undergo multiple programming and erasing cycles, and the blocks, as they are written, may create more and more defects or memory imperfections as the write cycling counts increase. For example, NAND defects including broken word lines (WL) or wordline to wordline (WL-WL) shorts may result in data errors. These defects or cell imperfections may lead to memory degradation. The degradation of a memory cell may cause the memory system behavior to deteriorate and system operations may eventually fail. Prevention of programming errors may require an identification of problems or errors in the memory.

SUMMARY

A non-volatile memory (NVM) system may be analyzed to identify a bit error rate (BER) mapping for the memory. The BER mapping may be used for identifying erroneous bits, managing them, and using them for the system maintenance and system recovery. A complete BER map may be stored in main memory while a cached version of the BER map may be stored in random access memory (RAM). The cached version may identify only the top and bottom portion rather than the complete and sorted map. For example, the top X % and bottom Y % (in terms of error rate) may be cached in the RAM for quicker access. The cached BER map may be updated based on future reads and future programming may rely on the cached BER map for selecting blocks to program.

BRIEF DESCRIPTION OF THE PRESENTLY PREFERRED EMBODIMENTS

A memory system suitable for implementing embodiments of this disclosure include non-volatile memory (NVM). In one example, the NVM may be flash memory such as NAND flash, where a high capacity may be achieved with its string architecture. Other types of memory with a memory cell that includes accessing a wordline and accessing a bit line may also be used. These memories may include but are not limited to the NOR, ORNAND, 3D memory and charge trapping memory with material such as silicon nitride, and phase change memory such as ReRAM, and semi-volatile memory such as DRAM and SRAM. As one example, a flash memory system suitable for use in implementing aspects of the invention is shown in FIGS. 1-4. As discussed flash memory is merely exemplary and other memory systems may utilize a BER map and a cached BER map as described.

Figure 1:
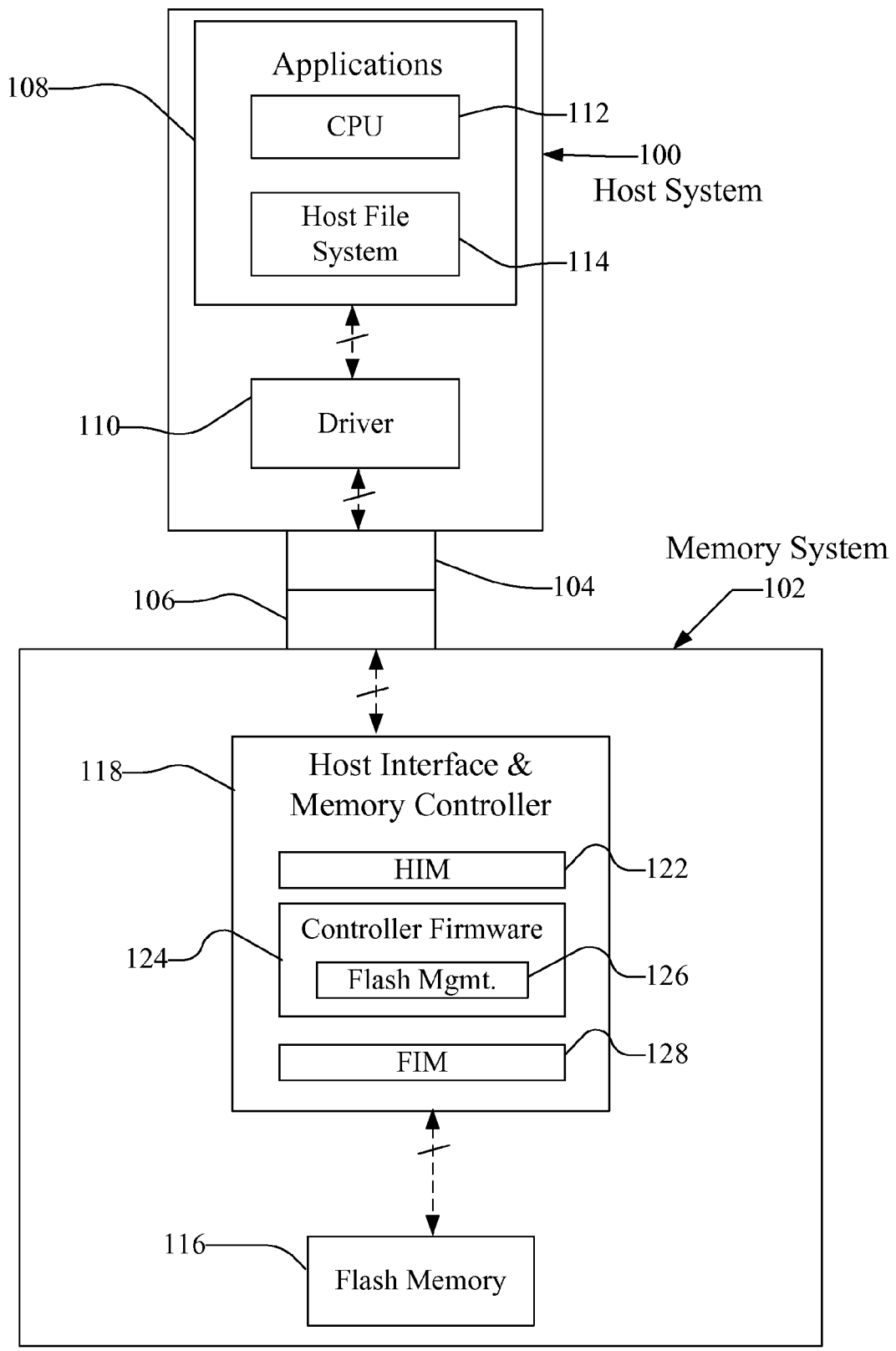
FIG. 1 is a block diagram of a host connected with a memory system having non-volatile memory.

A host system 100 of FIG. 1 stores data into and retrieves data from a flash memory 102. The flash memory may be embedded within the host, such as in the form of a solid state disk (SSD) drive installed in a personal computer. Alternatively, the memory 102 may be in the form of a flash memory card that is removably connected to the host through mating parts 104 and 106 of a mechanical and electrical connector as illustrated in FIG. 1. A flash memory configured for use as an internal or embedded SSD drive may look similar to the schematic of FIG. 1, with one difference being the location of the memory system 102 internal to the host. SSD drives may be in the form of discrete modules that are drop-in replacements for rotating magnetic disk drives. As described, flash memory may refer to the use of a negated AND (NAND) cell that stores an electronic charge.

Examples of commercially available removable flash memory cards include the CompactFlash (CF), the MultiMediaCard (MMC), Secure Digital (SD), miniSD, Memory Stick, SmartMedia, TransFlash, and microSD cards. Although each of these cards may have a unique mechanical and/or electrical interface according to its standardized specifications, the flash memory system included in each may be similar. These cards are all available from SanDisk Corporation, assignee of the present application. SanDisk also provides a line of flash drives under its Cruzer trademark, which are hand held memory systems in small packages that have a Universal Serial Bus (USB) plug for connecting with a host by plugging into the host's USB receptacle. Each of these memory cards and flash drives includes controllers that interface with the host and control operation of the flash memory within them.

Host systems that may use SSDs, memory cards and flash drives are many and varied. They include personal computers (PCs), such as desktop or laptop and other portable computers, tablet computers, cellular telephones, smartphones, personal digital assistants (PDAs), digital still cameras, digital movie cameras, and portable media players. For portable memory card applications, a host may include a built-in receptacle for one or more types of memory cards or flash drives, or a host may require adapters into which a memory card is plugged. The memory system may include its own memory controller and drivers but there may also be some memory-only systems that are instead controlled by software executed by the host to which the memory is connected. In some memory systems containing the controller, especially those embedded within a host, the memory, controller and drivers are often formed on a single integrated circuit chip. The host may communicate with the memory card using any communication protocol such as but not limited to Secure Digital (SD) protocol, Memory Stick (MS) protocol and Universal Serial Bus (USB) protocol.

The host system 100 of FIG. 1 may be viewed as having two major parts, insofar as the memory device 102 is concerned, made up of a combination of circuitry and software. An applications portion 108 may interface with the memory device 102 through a file system module 114 and driver 110. In a PC, for example, the applications portion 108 may include a processor 112 for running word processing, graphics, control or other popular application software. In a camera, cellular telephone that is primarily dedicated to performing a single set of functions, the applications portion 108 may be implemented in hardware for running the software that operates the camera to take and store pictures, the cellular telephone to make and receive calls, and the like.

The memory system 102 of FIG. 1 may include non-volatile memory, such as flash memory 116, and a device controller 118 that both interfaces with the host 100 to which the memory system 102 is connected for passing data back and forth and controls the memory 116. The device controller 118 may be implemented on a single integrated circuit chip, such as an application specific integrated circuit (ASIC). The device controller 118 may include a multi-thread processor capable of communicating via a memory interface 128 having I/O ports for each memory bank in the flash memory 116. The device controller 118 may include an internal clock. The processor of the device controller 118 may communicate with an error correction code (ECC) module, a RAM buffer, and a boot code ROM via an internal data bus.

The device controller 118 may convert between logical addresses of data used by the host 100 and physical addresses of the flash memory 116 during data programming and reading. Functionally, the device controller 118 may include a Host interface module (HIM) 122 that interfaces with the host system controller logic 110, and controller firmware module 124 for coordinating with the host interface module 122, and flash interface module (FIM) 128. Flash management logic 126 may be part of the controller firmware 124 for internal memory management operations such as garbage collection. One or more flash interface modules (FIMs) 128 may provide a communication interface between the controller and the flash memory 116. The memory device firmware may handle memory in logical groups and the logical to physical address table (i.e. the global address table or "GAT") may have an entry for each logical group. In particular, the GAT page may include mapping of the logical to the physical address translation for each logical group.

A flash transformation layer ("FTL") or media management layer ("MML") may be integrated in the flash management 126 and may handle flash errors and interfacing with the host. In particular, flash management 126 is part of controller firmware 124 and FTL may be a module in flash management. The FTL may be responsible for the internals of NAND management. In particular, the FTL may be an algorithm in the memory device firmware which translates writes from the host 100 into writes to the flash memory 116. The FTL may include the logical block address ("LBA") map that translates addresses for the flash memory. An FTL algorithm may provide logical to physical address mapping which includes an algorithm to convert logical addresses from the file system to physical addresses of flash memory. The FTL 126 may include one or more algorithms for generating a BER mapping, generating a cached version of the BER mapping, updating either BER mapping, and utilizing the BER mapping during operation as discussed below with respect to FIGS. 5-8.

The memory cells may be operated to store two levels of charge so that a single bit of data is stored in each cell. This is typically referred to as a binary or single level cell (SLC) memory. SLC memory may store two states: 0 or 1. Alternatively, the memory cells may be operated to store more than two detectable levels of charge in each charge storage element or region, thereby to store more than one bit of data in each. This latter configuration is referred to as multi-level cell (MLC) memory. For example, MLC memory may store four states and can retain two bits of data: 00 or 01 and 10 or 11. Each bit of the two bits of data may represent a page bit of a lower page or a page bit of an upper page, where the lower page and upper page span across a series of memory cells sharing a common word line. Typically, the less significant bit of the two bits of data represents a page bit of a lower page and the more significant bit of the two bits of data represents a page bit of an upper page. Both types of memory cells may be used in a memory, for example binary SLC flash memory may be used for caching data and MLC memory may be used for longer term storage. In one embodiment, the flash memory 116 may include MLC and/or SLC memory. Further, the flash memory 116 may be 3D memory as further discussed below. In alternative embodiments, the flash memory 116 may be a different type of non-volatile memory. The memory may be included as part of the device controller 118 rather than as part of the flash memory 116 in some embodiments.

The flash memory 116 may be mostly MLC, while Random Access Memory (RAM) or cache may be SLC memory. Although not shown, the RAM may be part of the device controller 118, such as part of the FIM 128. The RAM may store a partial/cached version of the BER mapping while a more complete version of the BER mapping is stored in the flash memory 116. In one embodiment, the generation, updating, and usage of the complete BER map and/or the cached BER map may be controlled from the FTL or flash management 126.

Figure 2:
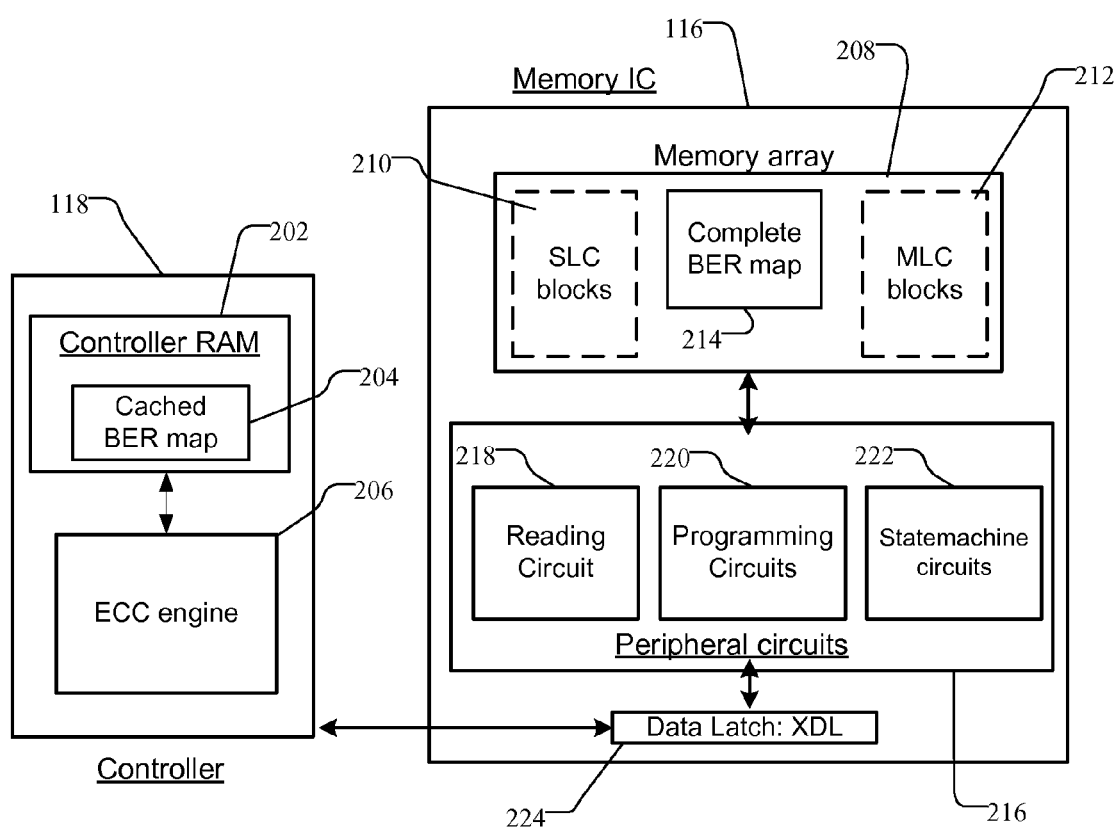
FIG. 2 is a block diagram of an alternative memory system.

FIG. 2 is a block diagram of an alternative memory system. FIG. 2 illustrates the controller and the memory system or memory integrated circuit 116. The controller 118 includes a controller RAM 202 which stores a cached version of the BER map 204. The cached version of the BER map 204 may be a partial version of the complete BER map 214 that stores a subset of the data (e.g. the top x % and bottom x % of bits based on the error rate). The cached BER map 204 and complete BER map 214 are further discussed below with respect to FIG. 5. The controller 118 includes an error correction code (ECC) engine 206 that may perform error identification and correction, such as a read scrub or enhanced post-write-read error management (EPWR). In one embodiment, the ECC engine 206 generates the bit error rates that populate the BER map. In particular, the ECC engine 206 may calculate or determine whether there is an error (such as an uncorrectable error) for each read and that data is used to populate the BER map. This ECC process may be part to the read operation, so the additional recording in the BER map may not be very costly (in terms of processing). The ECC engine 206 may populate and/or update the BER-map.

The memory 116 may include a memory array 208 that is the actual memory. The memory array 208 may any type of memory. As described, the memory array 208 may be NVM flash memory and includes both SLC blocks 210 and MLC blocks 212. The complete version of the BER map 214 may also be stored in the memory. Because the complete version of the BER map 214 may be large, only a portion of that map is stored in RAM 202 as the cached BER map 204. Storing the entire BER map 214 in RAM may not be feasible because it would take up too much space in the RAM, but it may be stored in the memory array 208. Storage of only a portion (the most relevant: top/bottom bit error rates) of the BER map in the RAM 202 takes up less RAM space. In various embodiments, the portion of the BER map that is stored in RAM may be varied. In one embodiment, when the RAM space is not an issue, the complete BER map 214 may be stored in RAM 202.

The memory integrated circuit may also include peripheral circuits 216. Exemplary peripheral circuits 216 include a reading circuit 218, programming circuits 220, and state machine circuits 222. The reading circuit 218 may generate read scrubs. The programming circuits 220 may program/write data to appropriate locations in the memory. The state machine circuits 222 may perform other functions for the memory circuit. A data latch 224 may operate as an interface with the controller 118. Either the memory system in FIG. 1 and/or FIG. 2 may implement the bit error rate (BER) mappings described below.

Flash memory may include a number of flash dies used for persistent data storage and the individual dies may be partitioned into blocks. The blocks may further be divided into a number of pages that represent the smallest portion of data that can be individually read from and/or programmed. In other words, a page may be the minimum program/write size. Some devices may implement multiple-plane operation that enables two or more pages to being acted upon simultaneously. In such a case, data is read and written at a size that is larger than a single physical page, e.g., the physical page size multiplied by an integer representing the number of planes. Blocks may be the minimum amount of data for an erase operation. In other words, the device may only erase entire blocks rather than portions of the block. In one embodiment, each page may be made of a plurality of memory cells.

Figure 3:
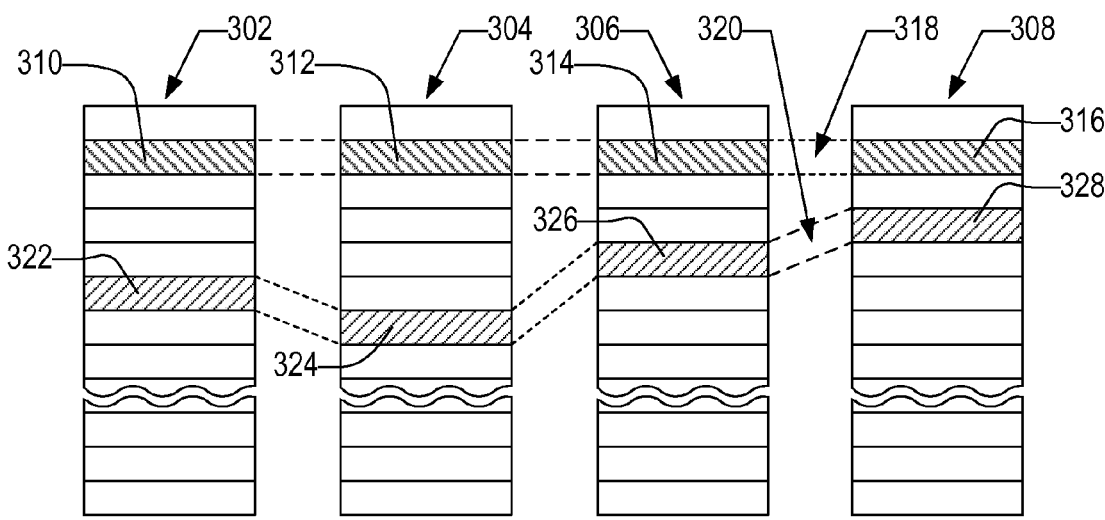
FIG. 3 is an example physical memory organization of a memory system.

FIG. 3 conceptually illustrates an organization of the flash memory 116 (FIG. 1) as a cell array. The flash memory 116 may include multiple memory cell arrays which are each separately controlled by a single or multiple memory controllers 118. Four planes or sub-arrays 302, 304, 306, and 308 of memory cells may be on a single integrated memory cell chip, on two chips (two of the planes on each chip) or on four separate chips. Although not shown in FIG. 3, the meta-blocks described below with respect to FIG. 6 may be linked from across different dies. For example, there may be two planes per di and the meta-block linking shown in FIG. 6 links planes from different dies.

Other numbers of planes, such as 1, 2, 8, 16 or more may exist in a system. The planes may be individually divided into groups of memory cells that form the minimum unit of erase, hereinafter referred to as blocks. Blocks of memory cells are shown in FIG. 3 by rectangles, such as blocks 310, 312, 314, and 316, located in respective planes 302, 304, 306, and 308. There can be any number of blocks in each plane. The block of memory cells is the unit of erase, and the smallest number of memory cells that are physically erasable together. For increased parallelism, however, the blocks may be operated in larger metablock units or chunks. One block from each plane is logically linked together to form a metablock. The four blocks 310, 312, 314, and 316 are shown to form one metablock 318. All of the cells within a metablock are typically erased together. The blocks used to form a metablock need not be restricted to the same relative locations within their respective planes, as is shown in a second metablock 320 made up of blocks 322, 324, 326, and 328. Although it is usually preferable to extend the metablocks across all of the planes, for high system performance, the memory system can be operated with the ability to dynamically form metablocks of any or all of one, two or three blocks in different planes. This allows the size of the metablock to be more closely matched with the amount of data available for storage in one programming operation. As described below with respect to FIG. 6, the meta-block may be created with planes from different dies. In other words, each meta-block includes planes from different dies.

Figure 4:
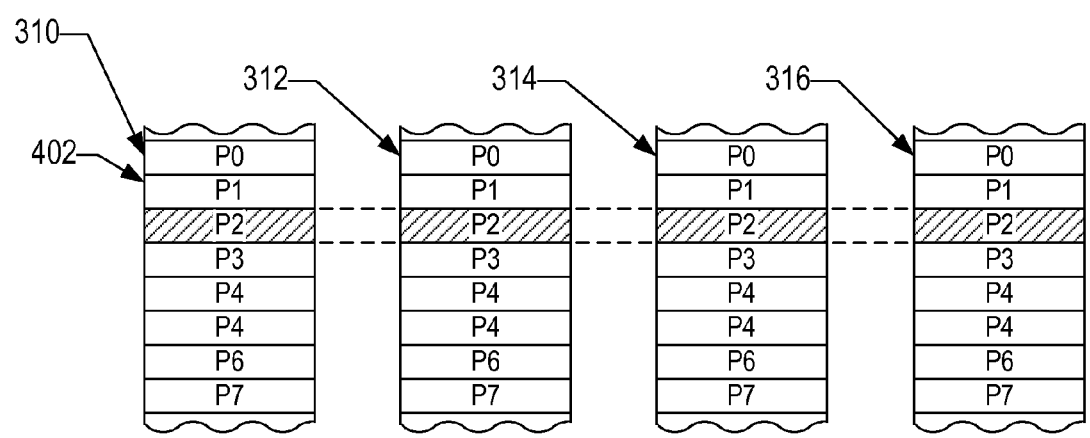
FIG. 4 is an expanded view of a portion of the physical memory of FIG. 3.

The individual blocks may be divided for operational purposes into pages of memory cells, as illustrated in FIG. 4. The memory cells of each of the blocks 310, 312, 314, and 316, for example, are each divided into eight pages P0-P7. Alternatively, there may be 16, 32 or more pages of memory cells within each block. The page is the unit of data programming and reading within a block, containing the minimum amount of data that are programmed or read at one time. However, in order to increase the memory system operational parallelism, such pages within two or more blocks may be logically linked into metapages. A metapage 402 is illustrated in FIG. 3, being formed of one physical page from each of the four blocks 310, 312, 314, and 316. The metapage 402, for example, includes the page P2 in each of the four blocks but the pages of a metapage need not necessarily have the same relative position within each of the blocks. A metapage may be the maximum unit of programming.

Although not shown, there may be a flash memory unit ("FMU"). The FMU may be a smallest data chunk that the host can use to read or write to the flash memory. Each page may have any number of FMU's. For example, page P0 may have 1, 2, 4, or 8 FMU's in exemplary embodiments.

The memory cells may be operated to store two levels of charge so that a single bit of data is stored in each cell. This is typically referred to as a binary or single level cell (SLC) memory. SLC memory may store two states: 0 or 1. Alternatively, the memory cells may be operated to store more than two detectable levels of charge in each charge storage element or region, thereby to store more than one bit of data in each. This latter configuration is referred to as multi-level cell (MLC) memory. For example, MLC memory may store four states and can retain two bits of data: 00 or 01 and 10 or 11. Both types of memory cells may be used in a memory, for example binary SLC flash memory may be used for caching data and MLC memory may be used for longer term storage. The charge storage elements of the memory cells are most commonly conductive floating gates but may alternatively be non-conductive dielectric charge trapping material.

Figure 5:
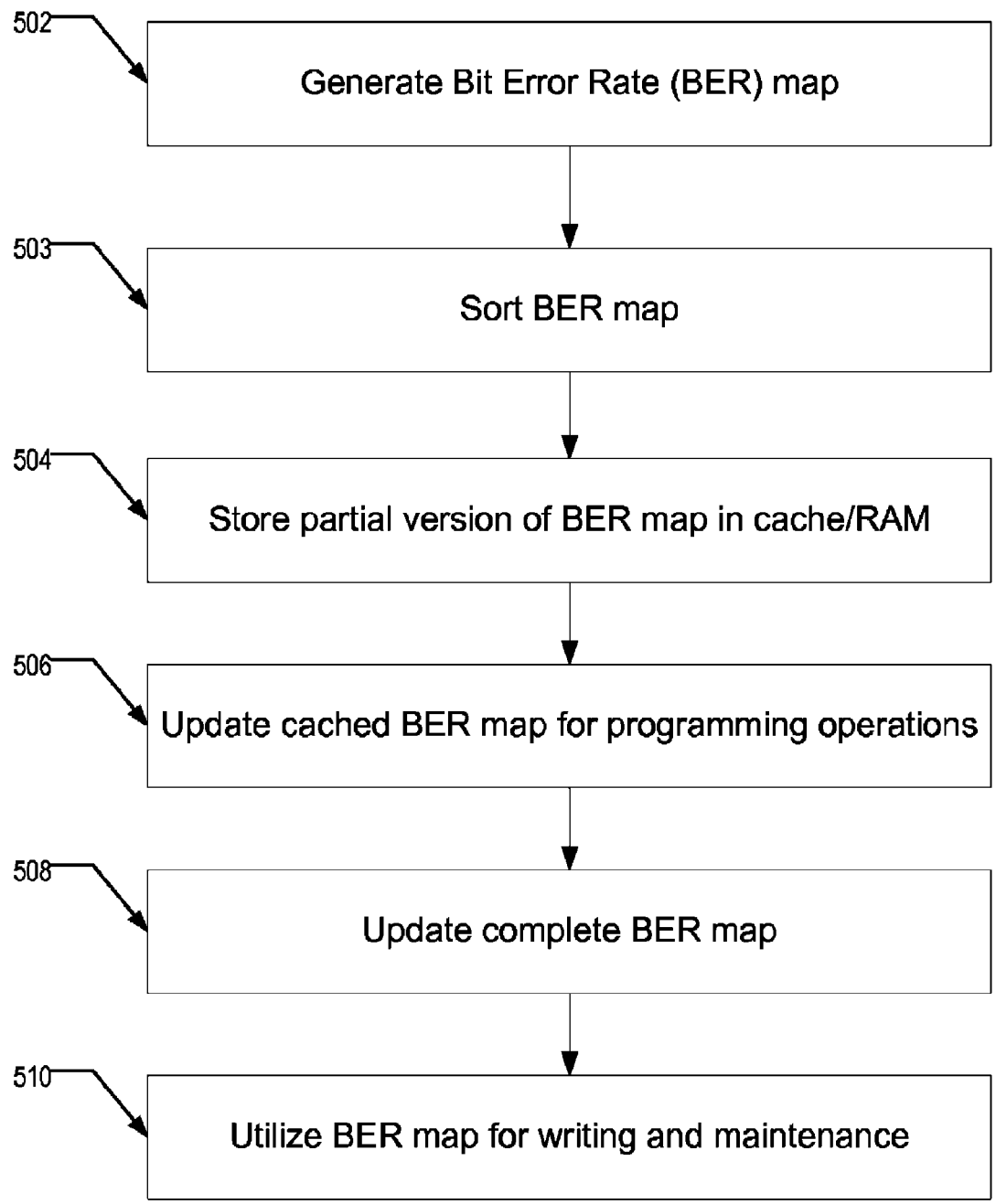
FIG. 5 is flow chart illustrating an exemplary bit error rate (BER) mapping process.

FIG. 5 is flow chart illustrating an exemplary bit error rate mapping process. In block 502, bit error rate (BER) mapping is generated. After being generated, the BER map may be sorted in block 503 in order to be able to identify relative BER rates stored in the map. In particular, the top and bottom BER rates from the BER map are identified from the BER map to be stored in cache, so the BER map may be sorted to identify the top and bottom. In alternative embodiments, the sorting may occur at different times during the process, including when the BER map or partial version of the BER map are updated. A full version (with error rates for all bits) of the BER mapping may be stored in the memory (e.g. flash memory 116), while a partial version of the BER map is stored in cache as in block 504. The partial BER map may be stored in random access memory (RAM) for quicker access. The partial BER map may include only those bits with the highest and lowest error rates. For example, the top X % and bottom Y % of the BER values are the ones that are stored in the partial BER map in cache. In one example, the percentile may be X=1% and Y=2%, such that the highest 1% and lowest 2% of BER values may be stored in the BER mapping in cache/RAM. The values of X and Y may be different or they may be equal. For example, it may be desirable to maintain more top BER values in the mapping (e.g. X=2%) than those that are in the bottom BER values in the mapping (e.g. Y=0.5%).

The BER map is an exemplary data structure that stores error rates for different memory. In one embodiment, the error rates are per bit or byte, but may also be for memory cells, memory pages, wordlines, or other units. The data structure in the system may be for each physical wordline or each every m wordlines (m=1, 2, 4, 8, 16, . . . etc.) accessed by the system. For example, 128*4096=512K entries, if each entry needs 4 bytes, then the total is 4*512=2 megabytes of memory space. The data structure may be stored as the bitmap table (e.g. BER map), which may include every wordlines that has been accessed regardless of whether that wordline is currently being used. In one embodiment, the BER map may include a bit to indicate the validity of the wordline and a bit to indicate the type of BER of the wordline. For example, the type of BER may include data retention (DR) or read disturb (RD). The DR usually shifts the read voltage to the lower value which implies charge loss caused by the data retention, while RD may move the read voltage to the higher values. Table 1 below is an exemplary BER mapping:

TABLE 1

Exemplary BER Map Format

| Entry | BER Region | WL Validity | Failure Bit Type | Block Addr. | WL Offset |
|---|---|---|---|---|---|
| 0 | 60 | 1 | 1 | 0Ah | 1 |
| 1 | 55 | 0 | 1 | 01h | 5 |
| 2 | 32 | 0 | 0 | 100h | 67 |
| 3 | 31 | 1 | 1 | 203h | 98 |
| . . . | . . . | . . . | . . . | . . . | . . . |

The exemplary BER map format shown in Table 1 includes a number of entries. The BER region may be 6 bits for 64 regions. The BER region may utilize Table 2 to identify the failure bit count (FBC) limits for determining whether the cached BER map includes a particular entry. The WL validity is a wordline validity that may be one bit for indicating whether the wordline is currently being used or it may be used to identify an invalidated block. The validity may indicate whether the wordline has all its flash memory units (FMUs) valid. The failure bit type may include whether a failure is due to data charge. The type bit may be used to indicate the data retention (DR) scenario. The block address is the address of the block and the WL offset is the wordline group offset.

The BER region in Table 1 may be used to identify the high end failure bit count (FBC) and the low end FBC. These FBC limits may be used to determine which bits are stored in the cached version of the BER map in RAM. The low end FBC are those bits that are least prone to failure, while the high end FBC are those bits that are most prone to failure. As discussed the high end and the low end may be a percentile of the overall FBC (e.g. high end=top X % FBC and low end=bottom Y % FBC). The value of X and/or Y may depend on how large the partial BER map that is stored in RAM. In one embodiment, the values stored in Table 2 may be part of Table 1. In other words, Table 1 may be modified to include both the low end FBC and high end FBC in a single table.

TABLE 2

Exemplary BER Map Regions

| BER Region | Low End FBC | High End FBC |
|---|---|---|
| 0 | 0 | 10 |
| 1 | 11 | 20 |
| 2 | 21 | 30 |
| . . . | . . . | . . . |
| 63 | 631 | 640 |

The BER region may establish a particular range of the BER values. The BER may be from 0% to x % and is divided into n regions where each region covers x %/n range. Whenever there is a read operation on the wordline, the BER may be calculated and the region to which the BER belongs to is recorded.

The BER map may be dynamic because it is updated as in block 506. The BER map operation may include reading, programming, and maintenance. The updating in block 506 may include the reading operation. When reading the wordline the BER number may be updated for each operation (e.g. direct cell voltage distribution (CVD)) for the BER-map.

In block 508, the complete BER map is updated. In one embodiment, the cached BER map is updated first in block 506 and then based on those updates; the complete BER map stored in flash is also updated. In alternative embodiments, the complete BER map may be updated first or simultaneously with the cached BER map. If a read is of data that is not part of the cached BER map, then the complete BER map may be the only update since that data is not part of the cached BER map.

The BER map may be utilized for writing and maintenance operations in block 510. For example, the programming may include selecting the erased block (i.e. a block has been released from the usage pool) that has the least BER region according to the BER-map (average of all the wordlines BER values). For maintenance purposes, a read scrub may identify and scrub the valid wordline with the highest BER. For relocation/copy, the blocks with the most invalid WLs may be chosen as the source. Finally, refreshing may be according to the BER number, validity and DR type bit.

Figure 6:
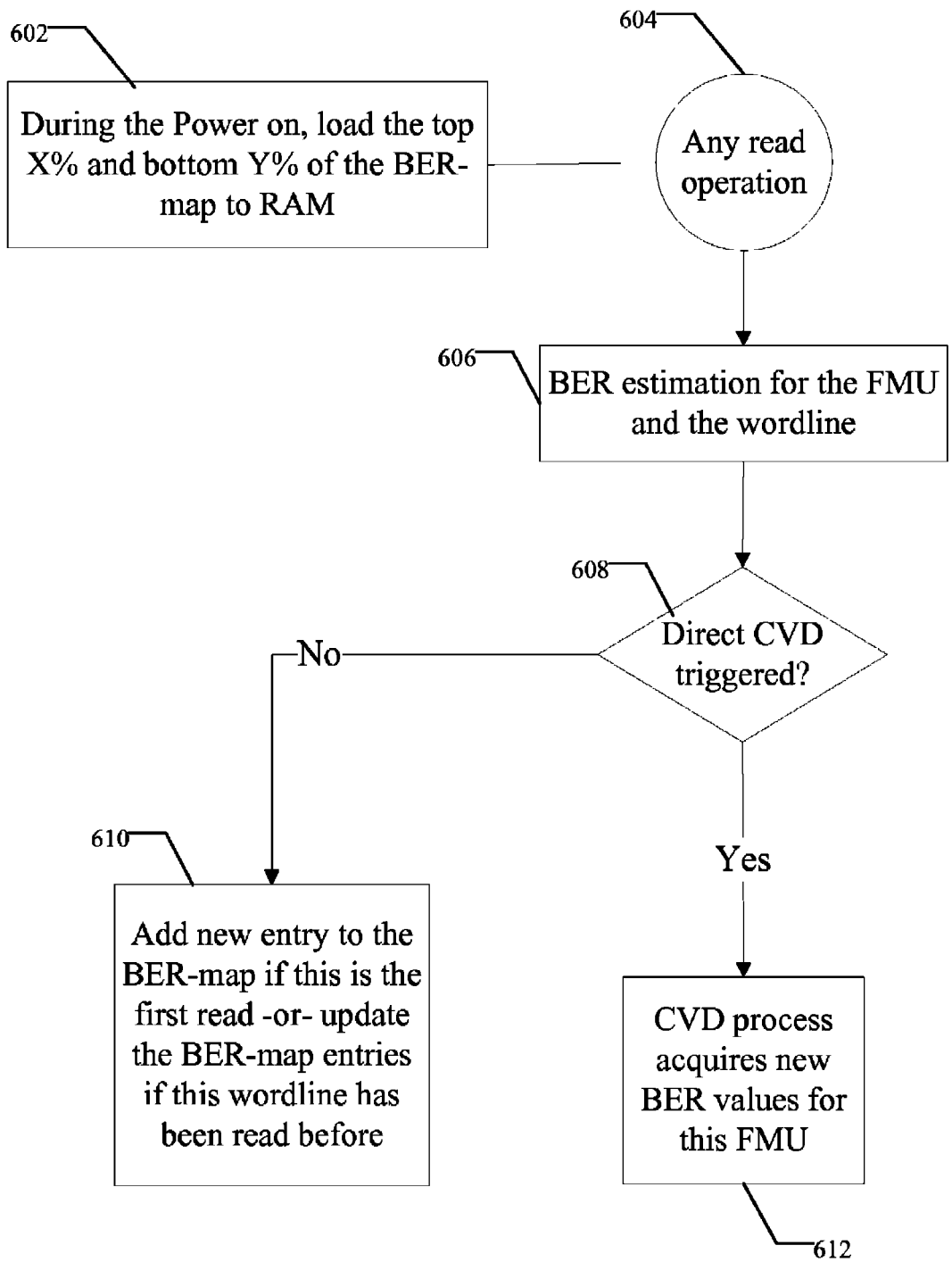
FIG. 6 is an exemplary process for updating the bit error rate map.

FIG. 6 is an exemplary process for updating the bit error rate (BER) map. In block 602, the top X % and bottom Y % of the BER map is loaded to RAM. In one embodiment, this loading into the cache/RAM is during a power on operation. In block 604, a read operation is received at the device. As part of the read operation, error checking is performed on the blocks that are read and this error information is used for the error rate calculation stored in the BER map. This error calculation includes BER estimation for the memory units and the wordline in block 606. In block 608, a determination is made as to whether direct cell voltage distribution (CVD) is triggered. CVD is an advanced version of dynamic read such that it may shift the read level either up/down by a certain voltage (e.g. 20 mV) and then read again. CVD allows for the real-time creation of better read conditions by shifting the read levels. If direct CVD is triggered in block 608, the CVD process acquires new BER values for the particular memory unit in block 612. The new BER values can be used to update the cached BER map and/or the complete BER map. If direct CVD is not triggered in block 608, then a new entry is added to the BER map in block 610 for the first read. Alternatively, in block 610, the BER map is updated if the wordline has been read previously (not the first read). When the BER map is to be updated, there may be a comparison of the values with the top and bottom X % of the BER values.

Figure 7:
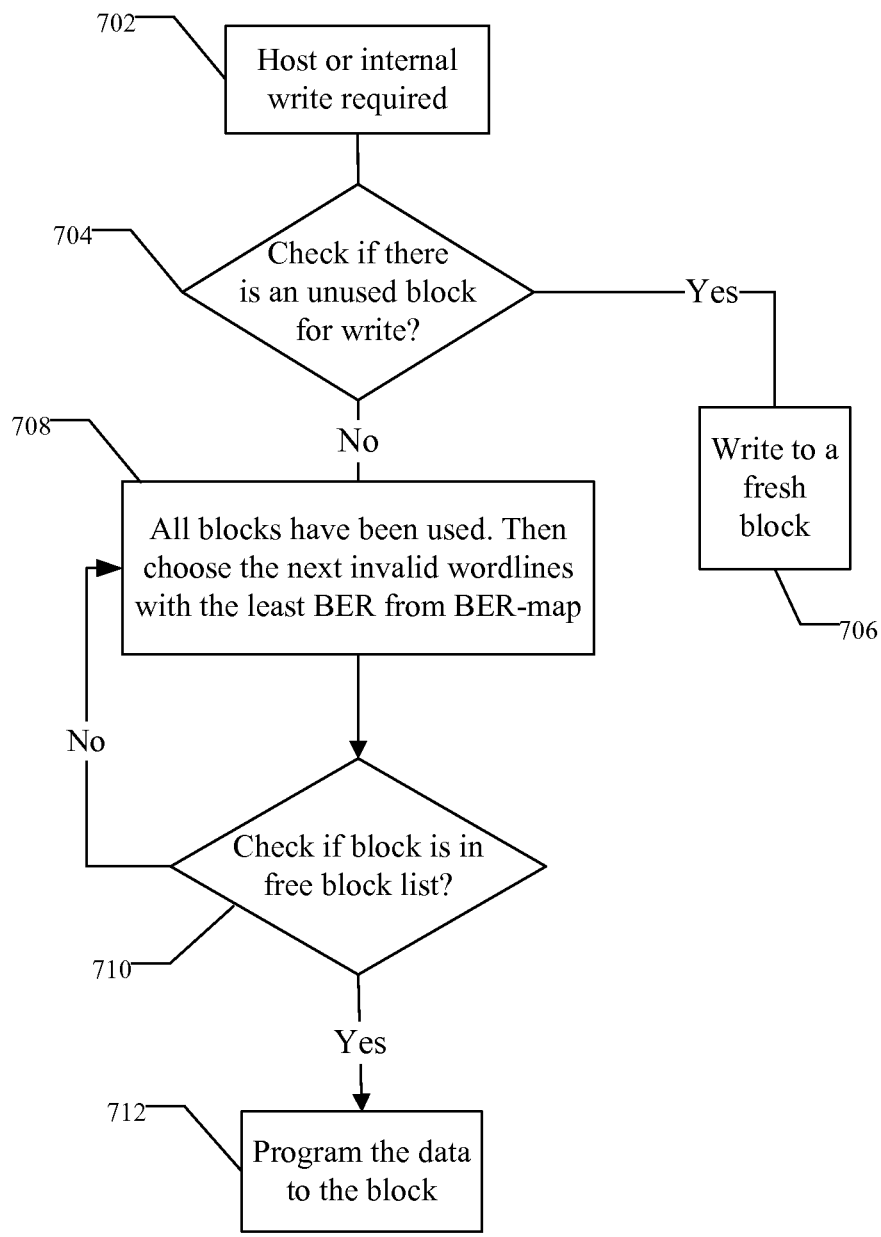
FIG. 7 is an exemplary process for a write operation using the bit error rate map.

FIG. 7 is an exemplary process for a write operation using the bit error rate (BER) map. In block 702, a write request is received at the memory device from a host or the write request may be part of an internal operation from the memory device itself. In block 704, there is a check to whether there is an unused block for writing. If there is an unused block, then the write is to a fresh/unused block as in block 706. A fresh block is a block that has not been programmed. Since it has never been programmed, it does not have a BER entry in the BER map. If there are no unused blocks for writes in block 704, then the next invalid wordlines are chosen based on the BER map. In particular, the wordlines with the lowest BER may be selected for the write. That selected wordline is check to determine whether the block is in a free block list as in block 710. If it is not in the free block list, then the selection in block 708 proceeds to select the next lowest BER from the BER map. When the selected block is in the free block list, then the data is programmed to the block in block 712.

Figure 8:
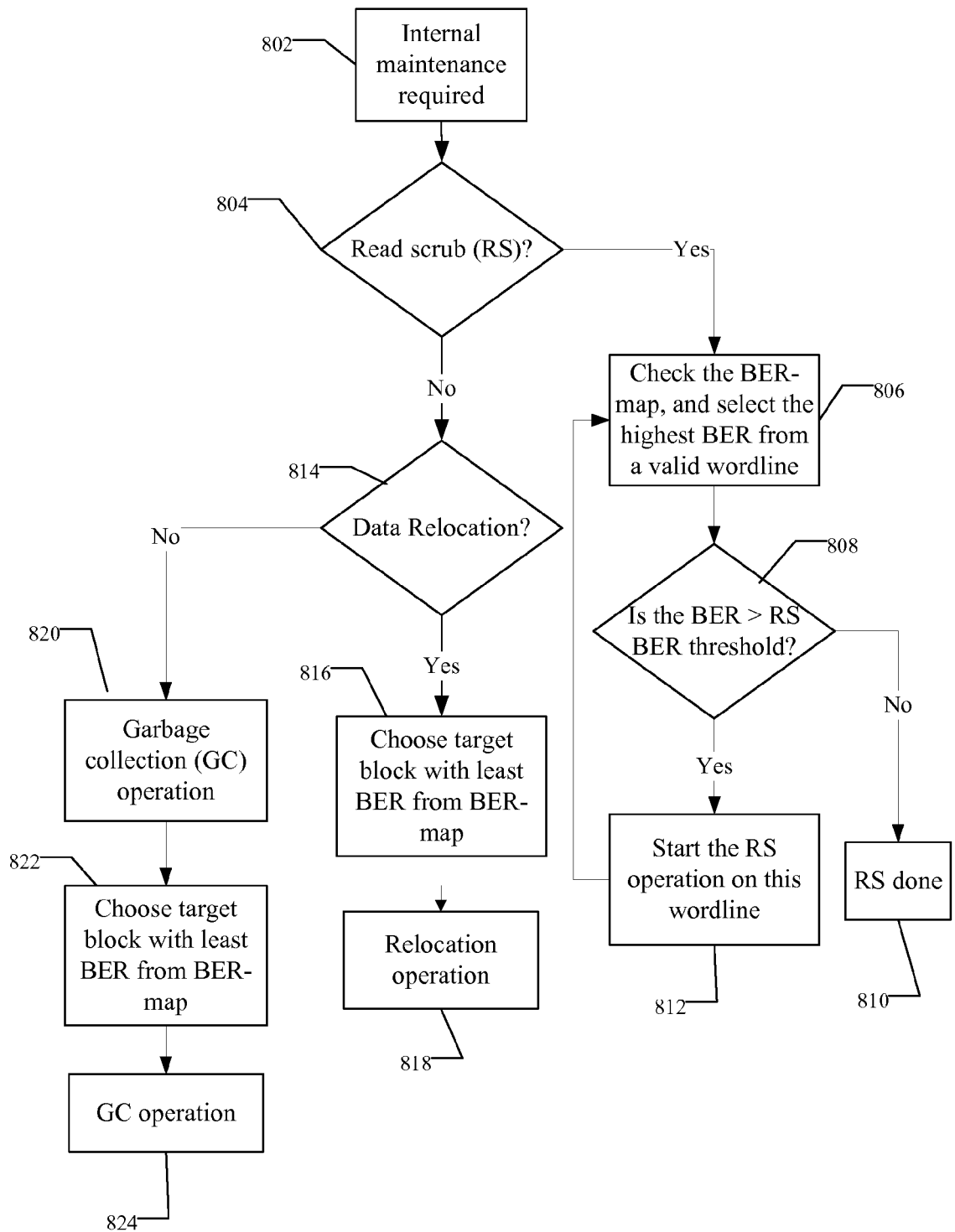
FIG. 8 is an exemplary process for a maintenance operation using the bit error rate map.

FIG. 8 is an exemplary process for a maintenance operation using the bit error rate (BER) map. In particular, FIG. 8 illustrates the usage of the BER map for selecting targeted blocks for maintenance operations. In block 802, an indication is received that internal maintenance is required. In block 804, a determination is made as to whether read scrub (RS) is needed. When RS is triggered, the BER map is checked and the highest BER is selected from a valid wordline as in block 806. If the BER is less than the RS BER threshold in block 808, then the RS is done in block 810. If the BER is greater than the RS BER threshold in block 808, then the RS is started on this wordline as in block 812. When starting the RS operation on this wordline, the next highest BER from a valid wordline may be checked in block 806 as the RS operation is performed iteratively.

When there is no RS in block 804, a data relocation may be considered in block 814. When data relocation is performed in block 814, a target block is selected with the least BER from the BER map in block 816. The relocation operation is performed on the selected target block in block 818. When there is no data relocation in bock 814, a garbage collection (GC) operation may be performed in block 820. A target block is chosen with the least BER from the BER map as in block 822. The GC operation is performed on the chosen target block in block 824

Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

The semiconductor memory elements located within and/or over a substrate may be arranged in two or three dimensions, such as a two dimensional memory structure or a three dimensional memory structure.

In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements in each column. The columns may be arranged in a two dimensional configuration, e.g., in an x-z plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-z) memory device levels. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Then again, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this invention is not limited to the two dimensional and three dimensional exemplary structures described but cover all relevant memory structures within the spirit and scope of the invention as described herein and as understood by one of skill in the art.

A "computer-readable medium," "machine readable medium," "propagated-signal" medium, and/or "signal-bearing medium" may comprise any device that includes, stores, communicates, propagates, or transports software for use by or in connection with an instruction executable system, apparatus, or device. The machine-readable medium may selectively be, but not limited to, an electronic, magnetic, optical, electromagnetic, infrared, or semiconductor system, apparatus, device, or propagation medium. A non-exhaustive list of examples of a machine-readable medium would include: an electrical connection "electronic" having one or more wires, a portable magnetic or optical disk, a volatile memory such as a Random Access Memory "RAM", a Read-Only Memory "ROM", an Erasable Programmable Read-Only Memory (EPROM or Flash memory), or an optical fiber. A machine-readable medium may also include a tangible medium upon which software is printed, as the software may be electronically stored as an image or in another format (e.g., through an optical scan), then compiled, and/or interpreted or otherwise processed. The processed medium may then be stored in a computer and/or machine memory.

In an alternative embodiment, dedicated hardware implementations, such as application specific integrated circuits, programmable logic arrays and other hardware devices, can be constructed to implement one or more of the methods described herein. Applications that may include the apparatus and systems of various embodiments can broadly include a variety of electronic and computer systems. One or more embodiments described herein may implement functions using two or more specific interconnected hardware modules or devices with related control and data signals that can be communicated between and through the modules, or as portions of an application-specific integrated circuit. Accordingly, the present system encompasses software, firmware, and hardware implementations.

The illustrations of the embodiments described herein are intended to provide a general understanding of the structure of the various embodiments. The illustrations are not intended to serve as a complete description of all of the elements and features of apparatus and systems that utilize the structures or methods described herein. Many other embodiments may be apparent to those of skill in the art upon reviewing the disclosure. Other embodiments may be utilized and derived from the disclosure, such that structural and logical substitutions and changes may be made without departing from the scope of the disclosure. Additionally, the illustrations are merely representational and may not be drawn to scale. Certain proportions within the illustrations may be exaggerated, while other proportions may be minimized. Accordingly, the disclosure and the figures are to be regarded as illustrative rather than restrictive.

We claim:

1. A memory device comprising:
a non-volatile storage having memory blocks storing data; and
a controller in communication with the non-volatile storage, the controller is configured to:
generate a bit error rate mapping that identifies an error rate for the memory blocks, wherein the bit error rate mapping is stored in the non-volatile storage; and
store a partial bit error rate mapping in cache that is a subset of the bit error rate mapping stored in the non-volatile storage, wherein the partial bit error rate mapping identifies an error rate for a portion of the memory blocks with a higher error rate and identifies an error rate for a portion of the memory blocks with a lower error rate.

2. The device of claim 1 wherein the portion of the memory blocks with the higher error rate comprise those memory blocks with an upper threshold percentage error rate and the portion of the memory blocks with the lower error rate comprise those memory blocks with a lower threshold percentage error rate.

3. The device of claim 2 wherein the upper threshold percentage and the lower threshold percentage are equal such that the partial bit error rate mapping comprises a sum of the upper threshold percentage with the lower threshold percentage of the bit error rate mapping.

4. The device of claim 1 wherein the bit error rate mapping is generated based on error determinations during read access to the memory blocks.

5. The device of claim 4 wherein the error determinations from an error correction code (ECC) engine.

6. The device of claim 1 wherein the controller is configured to:
receive read access requests;
determine a bit error rate for the memory blocks from the read access requests; and
update the partial bit error rate mapping when the determined bit error rates are higher than the portion of the memory blocks with the higher error rate or when the determined bit error rates are lower than the portion of the memory blocks with the lowest error rate.

7. The device of claim 6 wherein the controller is configured to:
update the bit error rate mapping using the updated partial bit error rate mapping by replacing entries in the bit error rate mapping with the updated entries in the partial bit error rate mapping.

8. The device of claim 6 wherein the determining the bit error rate comprises performing a cell voltage distribution operation.

9. The device of claim 1 wherein the cache comprises random access memory (RAM).

10. The device of claim 1 wherein the controller is configured to:
receive a write request;
utilize the partial bit error rate map to identify the portion of the memory blocks with the lower error rate; and
program, in response to the write request, the identified memory blocks.

11. The device of claim 1 wherein the controller is configured for:
utilizing the partial bit error rate map to identify the portion of the memory blocks with the higher error rate; and
performing maintenance operations on the identified memory blocks.

12. The device of claim 11 wherein the maintenance operations comprise read scrub, relocation, refreshing or garbage collection operation.

13. The device of claim 1 wherein the non-volatile storage comprises a three-dimensional (3D) memory configuration, and wherein the controller is associated with operation of the memory blocks.

14. A method, with a controller and blocks of memory, that optimizes memory operations through block selection, the method comprising the controller:
receiving a read request;
performing an error correction operation as part of a response to the read request, wherein the error correction operation determines a bit error rate for the blocks of memory that are subject to the read request;
recording the bit error rate for each of the blocks of memory in a mapping stored in the memory;
storing a partial mapping of the bit error rates in cache memory, wherein the partial mapping comprises a listing of the blocks with a highest and lowest bit error rates; and
updating the partial mapping when a block has a bit error rate that is among the highest bit error rates or the lowest bit error rates.

15. The method of claim 14 wherein the method further comprises the controller:
receiving a write request;
utilizing the partial mapping to identify blocks among the lowest error rate; and
programming, in response to the write request, the identified blocks.

16. The method of claim 14 wherein the portion of the blocks with the highest bit error rate comprise those memory blocks with an upper threshold percent bit error rate and the portion of the memory blocks with the lowest bit error rate comprise those memory blocks with a lower threshold percent bit error rate.

17. The method of claim 14 wherein the error correction operation is from an error correction code (ECC) engine or a cell voltage distribution (CVD) operation.

18. The method of claim 14 wherein the method further comprises:
updating the mapping stored in the memory using the updated partial mapping.

19. The method of claim 14 wherein the cache comprises random access memory (RAM).

20. A flash memory device comprising:
a non-volatile storage comprising memory blocks; and
a controller in communication with the non-volatile storage, the controller is configured for:
storing a bit error rate mapping in the non-volatile storage;
storing a partial bit error rate mapping in a cache, wherein the partial bit error rate mapping comprises a portion of higher and lower bit error rates from the bit error rate mapping;
initializing the bit error rate mapping and partial bit error rate mapping with a default bit error rate;
updating the partial bit error rate mapping, when a bit error rate exceeds a lowest of the higher portion of bit error rates in the partial bit error rate mapping or when a bit error rate is below a highest of the lower portion of the bit error rates in the partial bit error rate mapping, wherein the bit error rate is calculated for a particular memory block when the device receives a read request for the particular, memory block; and
updating the bit error rate mapping in the non-volatile storage with the updates from the partial bit error rate mapping from the cache.

* * * * *